US006265290B1

(12) United States Patent
Moon et al.

(10) Patent No.: US 6,265,290 B1
(45) Date of Patent: Jul. 24, 2001

(54) METHOD FOR FABRICATING A THIN FILM TRANSISTOR AND A SUBSTRATE AND THIN FILM TRANSISTOR MANUFACTURED USING THE SAME

(75) Inventors: Kyu-Sun Moon, Suwon; Byung-Hoo Jung, Anyang, both of (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 09/421,477

(22) Filed: Oct. 20, 1999

(30) Foreign Application Priority Data

Oct. 20, 1998 (KR) ................................................. 98-43971
Jan. 13, 1999 (KR) ...................................................... 99-734

(51) Int. Cl.⁷ .................................................... H01L 21/00
(52) U.S. Cl. ........................... 438/505; 438/569; 438/166
(58) Field of Search ................................... 438/505, 569, 438/796, 166; 358/302, 293; 346/160, 107; 359/368, 234, 235; 372/24, 25, 57, 101

(56) References Cited

U.S. PATENT DOCUMENTS

| 4,438,461 | * | 3/1984 | Turner | 358/302 |
| 5,028,939 | * | 7/1991 | Hornbeck et al. | 346/160 |
| 5,300,956 | * | 4/1994 | Ohta et al. | 346/107 |
| 5,428,475 | * | 6/1995 | Tanaami et al. | 359/368 |
| 5,937,318 | * | 8/1999 | Warner, Jr. et al. | 438/505 |
| 6,160,824 | * | 12/2000 | Tanka | 372/24 |

FOREIGN PATENT DOCUMENTS

| 07-2027-30 | * | 2/1997 | (JP) | 21/336 |
| 10-1255-99 | * | 5/1998 | (JP) | 29/786 |

* cited by examiner

*Primary Examiner*—Charles Bowers
*Assistant Examiner*—Laura M Schillinger
(74) *Attorney, Agent, or Firm*—Howrey Simon Arnold & White, LLP (57) ABSTRACT

A method for fabricating a thin film transistor includes the steps of calculating a scan pitch of a laser beam such that an unevenly crystallized area and an evenly crystallized area of a crystallized polycrystalline silicon layer are alternately arranged at a regular interval, crystallizing an amorphous silicon layer to a polycrystalline silicon layer by scanning the laser beam according to the scan pitch, calculating a spacing pitch of active patterns from the scan pitch of the laser beam, and forming the active patterns in a selected portion of the polycrystalline silicon layer according to the spacing pitch.

10 Claims, 10 Drawing Sheets

METHOD FOR FABRICATING A THIN FILM TRANSISTOR AND A SUBSTRATE AND THIN FILM TRANSISTOR MANUFACTURED USING THE SAME

BACKGROUND OF THE INVENTION

1. Field of the Invention

The present invention relates to a method for fabricating a thin film transistor (TFT) used as an active element of a liquid crystal display (LCD) device, and more particularly, to a method for manufacturing a TFT that in-advance prevents active patterns from forming in the unevenly crystallized portion of a polycrystalline silicon layer. Further, the present invention relates to a substrate and a TFT fabricated using such a method.

2. Description of the Related Art

Recently, demands for flat panel displays increase rapidly as the video equipment, such as a high definition television develops.

LCDs are one of the representative flat panel displays, and are gaining in popularity since they consume less power and provide a high access speed, which electroluminescene display (ELD), vacuum fluorescence display (VFD), or plasma display panel (PDP) has failed to provide.

There are two types of LCDs; an active type and a passive type. An active type LCD has a high speed, an excellent view angle and a high contrast, since each pixel therein is controlled by active elements, such as a thin film transistor (TFT). Such LCDs are more suitable for a high definition TV that requires a resolution with pixels of 1 million or more.

Recently, studies of TFT used as an active element of LCD have further developed as the significance of TFT grows. Specifically, studies are concentrated on the techniques that employ polycrystalline silicon for TFTs. This is because polycrystalline silicon has mobility characteristics approximately 100 times or more excellent than those of the commonly used amorphous silicon.

Since polycrystalline silicon has excellent mobility characteristics, TFTs using such a polycrystalline silicon may serve not only as a switching element, but as an embedded driving circuit such as an inverter.

A general architecture of TFT using such a polycrystalline silicon is disclosed in U.S. Pat. No. 5,780,326 entitled "Fully planarized thin film transistor and process to fabricate same", U.S. Pat. No. 5,705,424 entitled "Process of fabricating active matrix pixel electrode", U.S. Pat. No. 5,583,366 entitled "Active matrix panel", U.S. Pat. No. 5,499,124 entitled "Polysilicon transistors formed on an insulation layer which is adjacent to a liquid crystal material" and in U.S. Pat. No. 5,393,682 entitled "Method for making tapered poly profile for TFT device manufacturing".

To employ polycrystalline silicon for TFT, amorphous silicon is deposited onto a glass substrate. Subsequently, the deposited amorphous silicon layer is scanned by an excimer pulse laser beam using XeCl, KCl, ArF, etc. so that the amorphous silicon layer is crystallized to a polycrystalline silicon layer. In such a case, the amorphous silicon layer is heated by absorbing the laser beam, and the heated amorphous silicon layer is then rapidly crystallized, thereby forming a polycrystalline silicon layer with a stable structure.

As described above, when an amorphous silicon layer is crystallized to a polycrystalline silicon layer using a laser beam, only the surface of the glass substrate is heated by the rapid scanning of the laser beam. Therefore, a polycrystalline silicon layer having excellent mobility characteristics can be obtained without damaging the glass substrate.

Methods of crystallizing amorphous silicon using a laser are disclosed in U.S. Pat. No. 5,589,406 entitled "Method of making TFT display", U.S. Pat. No. 5,306,651 entitled "Process for preparing a polycrystalline semiconductor thin film transistor", U.S. Pat. No. 5,372,836 entitled "Method of forming polycrystalline silicon film in process of manufacturing LCD", U.S. Pat. No. 5,403,762 entitled "Method of fabricating a TFT", U.S. Pat. No. 5,403,772 entitled "Method for manufacturing semiconductor device", and in U.S. Pat. No. 5,472,889 entitled "Method of manufacturing large sized thin film transistor liquid crystal display panel.

On the polycrystalline silicon layer formed through the crystallization of amorphous silicon layer, a gate electrode, and a source/drain electrode are formed. The source/drain electrode is electrically connected to a pixel electrode of Indium Tin Oxide (ITO), thereby fabricating a TFT.

However, such a conventional method of fabricating a TFT has several problems.

As described above, in order to use polycrystalline silicon for a TFT, a process of crystallizing the already formed amorphous silicon layer to a polycrystalline silicon layer using an excimer pulse laser beam is pre-required.

However, here, a portion of the amorphous silicon layer, for example, the portion exposed to an edge of the laser beam, has an extremely uneven crystallization than the portion exposed to the center of the laser beam. This is because the laser beam employed for the crystallization of the amorphous silicon has a high energy density at its center, and a low energy density at its edge.

When the laser beam scanning completes to crystallize the amorphous silicon layer to the polycrystalline silicon layer, some areas of the completed polycrystalline silicon layer, for example, a pixel area, a source drive area, and a gate drive area, have active patterns having a predetermined width.

As aforementioned, since laser beams have an unbalanced energy density between its center and its edge, the amorphous silicon layer crystallized by the laser beam also has a portion exposed to the edge of the laser beam, which has an extremely unstable crystallization than those exposed to the center. Accordingly, the amorphous silicon layer exposed to the edge of the laser beam cannot be completely crystallized to a polycrystalline silicon layer, and thus has an unstable state.

Here, if a portion of active patterns (to be formed later) is formed in the unevenly crystallized area, such active patterns may not work well.

To address this problem, methods for preventing active patterns from being formed in the unevenly crystallized area of the polycrystalline silicon layer are required. However, the conventional method failed to suggest such a method.

When active patterns are formed in the unevenly crystallized area of the polycrystalline silicon layer, TFTs formed on those active patterns will not work well.

SUMMARY OF THE INVENTION

Therefore, it is an object of the present invention to prevent active patterns from being formed in an unevenly crystallized area of a polycrystalline silicon layer.

It is another object of the present invention to allow active patterns normally perform their original function by preventing active patterns from being formed in an unevenly crystallized area of a polycrystalline silicon layer.

It is still another object of the present invention to maintain a normal operation of a thin film transistor using such an active pattern.

To accomplish the above object, in the present invention, an amorphous silicon layer is crystallized into a polycrystalline silicon layer by scanning laser beams according to a predetermined scan pitch, and the spacing pitches of active patterns are controlled based on the scan pitch of laser beams when active patterns spaced by a predetermined spacing pitch are formed in a portion of the polycrystalline silicon layer. In conventional methods, of course, active patterns are formed independently of the scanning process of the laser beam.

For this, in the present invention, the spacing pitch of active patterns may have $Z'=nZ$ (wherein, $Z'$ denotes the spacing pitch of active patterns, Z denotes the scan pitch of laser beam, and n is an integer) relation with respect to the scan pitch of a laser beam. In such a case the spacing pitch of active patterns is integer-proportional to the scan pitch of laser beam.

For instance, if the scan pitch of laser beam maintains 150 $\mu$m, the spacing pitch of active patterns is controlled to have 150 $\mu$m, the integer-proportion (in this case, 1 time) to the scan pitch of laser beam, while making a TFT. In such a case, active patterns are selectively formed only in an evenly crystallized area, avoiding an unevenly crystallized area of polycrystalline silicon layer. As a result, active patterns perform their unique function normally.

To obtain practical effects of the present invention, an unevenly crystallized area and an evenly crystallized area are formed alternately in-advance. For this, in the present invention, the scan pitch of a laser beam is calculated by $Z=(X-y)/n$ (wherein, Z denotes a scan pitch of a laser beam, X denotes a width of a laser beam, y denotes a width of an unevenly crystallized area, and n is an integer). In such a case, the laser beam can crystallize the amorphous silicon layer to have evenly crystallized area and unevenly crystallized area alternately. Thus, the evenly crystallized area of the polycrystalline silicon layer is formed larger, at least, than the width of each active pattern.

When the present invention is implemented, active patterns are selectively formed only in the polycrystalline silicon area which is evenly crystallized, providing TFTs of a good quality.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENTS

The present invention will be explained in more detail with reference to the attached drawings.

Figure 1:
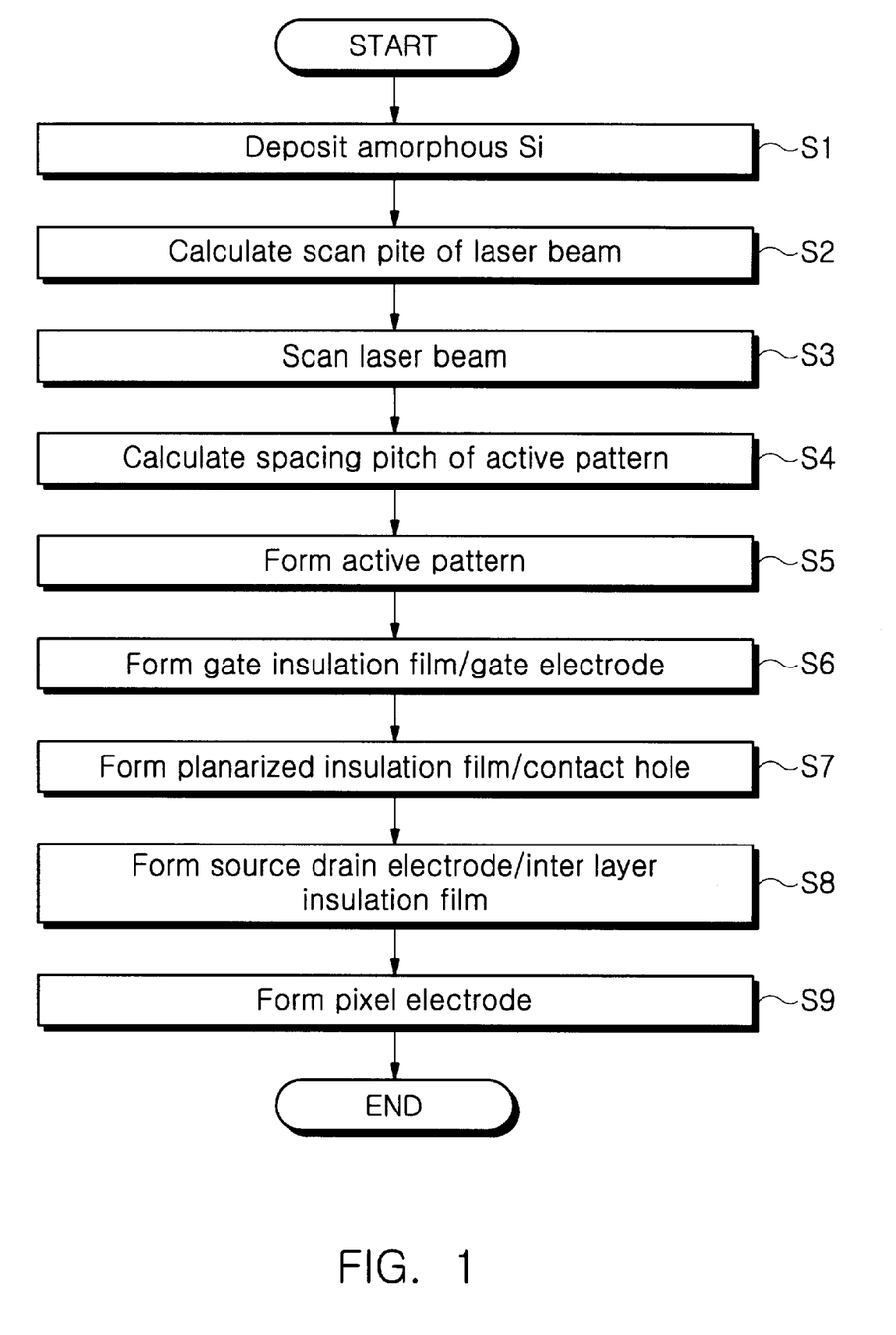
FIG. 1 is a flowchart showing a method for fabricating TFTs according to the present invention.

As shown in FIG. 1, first, an amorphous silicon layer is deposited and formed by a plasma-enhanced chemical vapor deposition (PECVD) process on a substance pervious to light, for example, a glass substrate (step S1).

Figure 2:
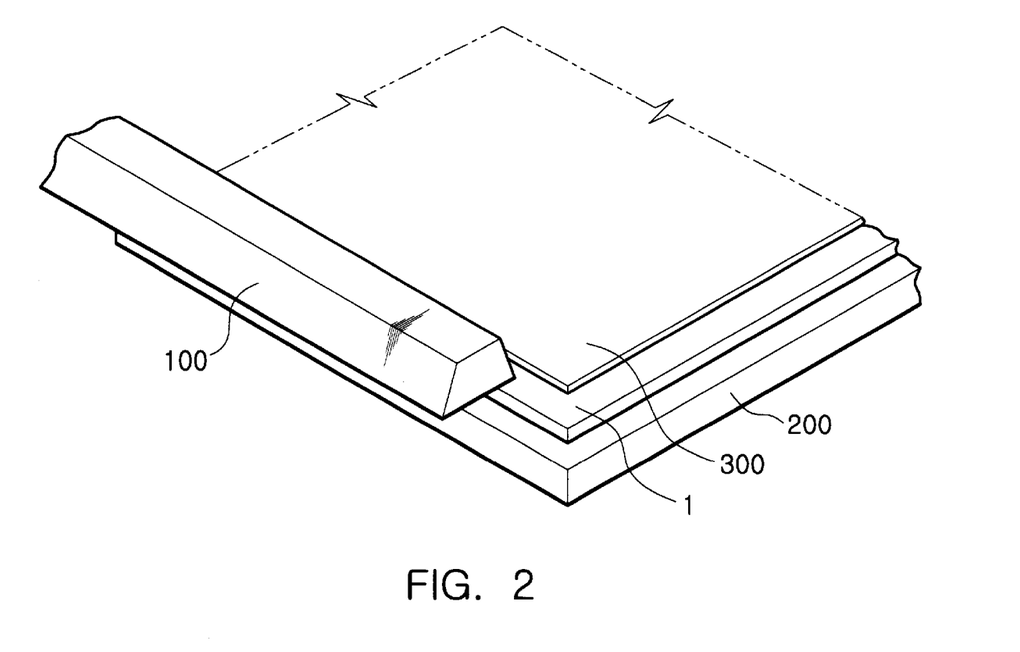
FIG. 2 shows a process of amorphous silicon layer crystallization according to the present invention.

Subsequently, as shown in FIG. 2, a laser beam is scanned by a predetermined pitch onto an amorphous silicon layer 300 formed on a substrate 1 using a laser tool 100 (step S3). In such a case, amorphous silicon layer 300 is heated to a predetermined temperature by absorbing the laser beam, and is rapidly annealed for crystallization to a polycrystalline silicon layer. To obtain a practical effect of the present invention, a precise scan pitch of laser beam (step S2) has to be calculated prior to scanning a laser beam. This will be discussed later.

Here, an XY table 200 with substrate 1 mounted thereupon is arranged under laser tool 100. XY table 200 moves forward under laser tool 100 by a driving motor (not shown), thus, the laser beam radiated from laser tool 100 may scan the surface of amorphous silicon layer 30C) by a predetermined pitch.

Figure 3:
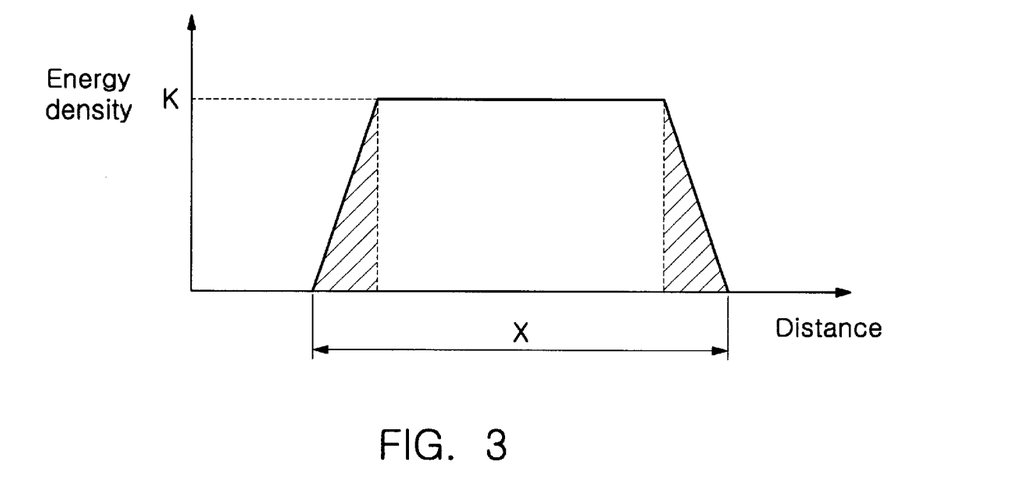
FIG. 3 is a graphical diagram showing a profile characteristic of a laser beam employed according to the present invention.

As shown in FIG. 3, the laser beam radiated from laser tool 100 has width X, and a profile characteristic of a high energy density at its center portion and a low energy density at its edge portion.

When such a laser beam scans amorphous silicon layer 300 by a predetermined pitch, amorphous silicon layer 300 is unevenly crystallized at the portion exposed to the edge of the laser beam.

Figure 4A:
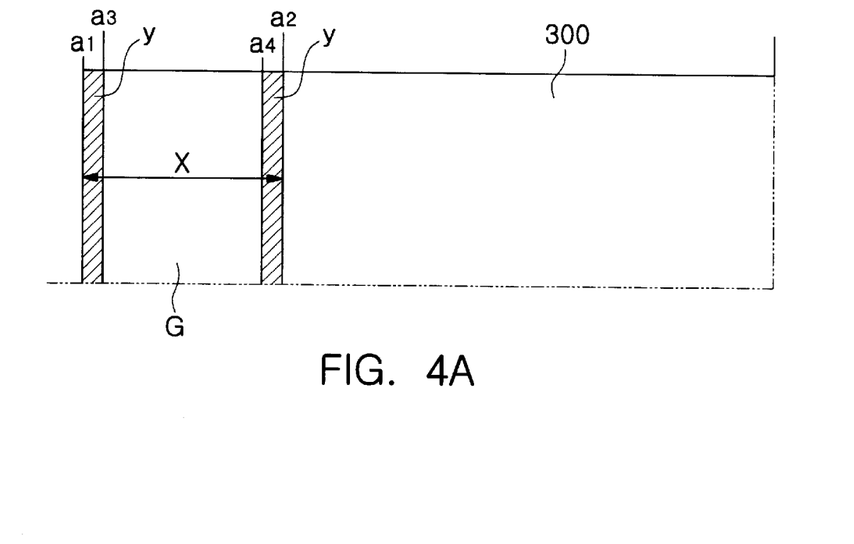
FIGS. 4A to 4C show a concept of a laser beam scanning process according to an embodiment of the present invention.

As shown in FIG. 4A, when the laser beam that forms outer lines a1 and a2, while maintaining width X, scans amorphous silicon layer 300, unevenly crystallized area y is formed in the portion of amorphous silicon layer 300 exposed to both edges of the laser beam, i.e., portions between lines a1 and a3, and a2 and a4. Here, G denotes the evenly crystallized area, i.e., the portion excluding the unevenly crystallized area y from amorphous silicon layer 300 exposed by the width X of the laser beam.

Figure 4B:
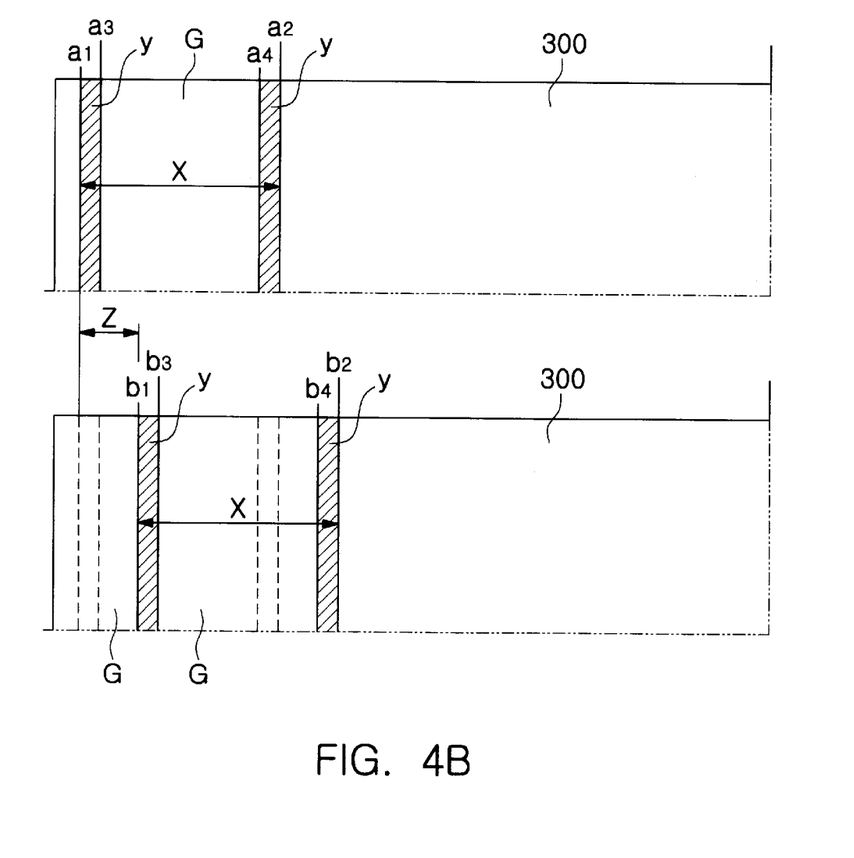

As shown in FIG. 4B, when the laser beam having initial outer lines a1 and a2 moves by the amount of scan pitch Z and forms another outer lines b1 and b2, unevenly crystallized area y is formed in the portion of amorphous silicon layer 300 exposed to both edges of the laser beam, i.e., portions between lines b1 and b3, and b2 and b4.

Figure 4C:
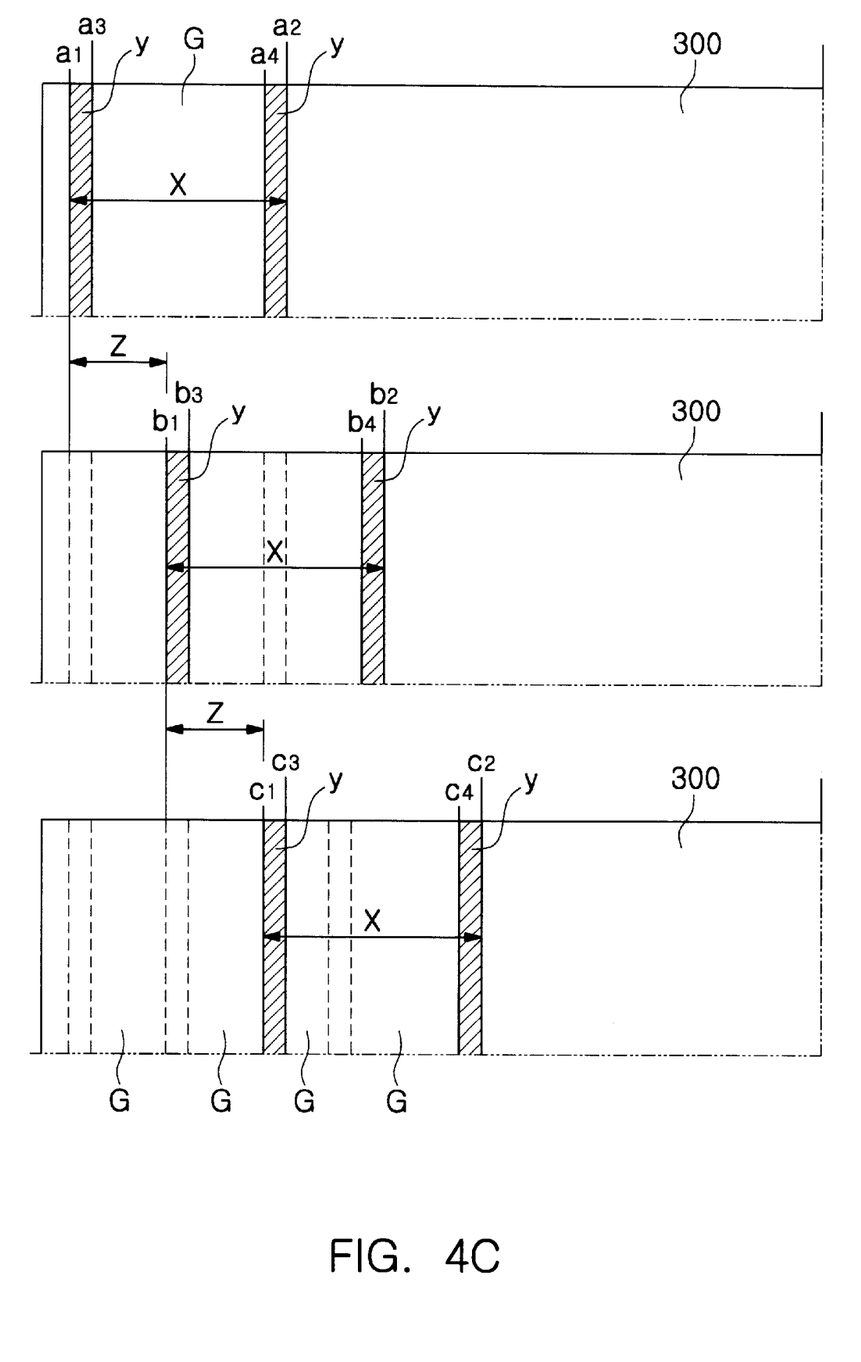

As shown in FIG. 4C, when the laser beam having outer lines b1 and b2 moves by the amount of scan pitch Z and forms the other outer lines c1 and c2, unevenly crystallized area y is formed in the portion of amorphous silicon layer 300 exposed to both edges of the laser beam, i.e., portions between lines c1 and c3, and c2 and c4.

Such a laser beam scanning process is performed uniformly all over the amorphous silicon layer 300, and the laser beam scans the amorphous silicon layer 300 for a predetermined area to be superposed at every scan pitch.

As shown in FIG. 4C, when the laser beam having outer lines a1 and a2 while maintaining width X scans amorphous silicon layer 300, and forms outer lines b1 and b2 by moving by the amount of scan pitch Z, and forms again outer lines c1 and c2 by moving by the amount of scan pitch Z, the laser beam forms several superposed areas between lines a1 and c3.

Then, the above-described laser beam scanning process is repeatedly performed, to thereby crystallize the entire area of amorphous silicon layer 300 to a polycrystalline silicon layer.

In the present invention, an appropriate scan pitch value of the laser beam is calculated prior to the scanning of the laser beam so that the completed polycrystalline silicon layer can alternately have an unevenly crystallized area y and an evenly crystallized area G at regular intervals.

When the unevenly crystallized area y and evenly crystallized area G are alternately arranged in the polycrystalline silicon layer through such a calculation process, active patterns can be formed only in the evenly crystallized area G of the polycrystalline silicon layer. Active patterns may be formed in the evenly crystallized area G without falling on the unevenly crystallized area y, with an appropriate spacing pitch calculated by a formula, which will be discussed later.

The scan pitch of a laser beam according to the present invention is calculated by the following equation (1).

$$Z=(X-y)/n \qquad \text{Equation (1)}$$

(wherein, Z denotes scan pitch of a laser beam, X denotes an entire width of a laser beam, y denotes a width of an unevenly crystallized area, and n is an arbitrary integer).

Equation (1) is derived as follows.

As shown in FIGS. 4A to 4C, when the laser beam having outer lines a1 and a2 forms outer lines b1 and b2 by moving by the scan pitch Z, and forms again outer lines c1 and c2 by moving by the scan pitch Z, the following equation (2) provides the relationship between the scan pitch Z of a laser beam, the width X of a laser beam, and the width y of an unevenly crystallized area.

$$X=nZ+y \qquad \text{Equation (2)}$$

(wherein, Z denotes a scan pitch of a laser beam, X denotes an entire width of a laser beam, y denotes a width of an unevenly crystallized area, and n is an arbitrary integer).

Here, integer n of Equation (2) indicates the total number of laser beam movements within the width X by the amount of Z. Preferably, value of integer n maintains 1 or above.

As shown in FIG. 4C, when the laser beam havingouter lines a1 and a2 forms outer lines b1 and b2 by moving by the scan pitch Z, and forms again outer lines c1 and c2 by moving by the scan pitch Z, the laser beam moves twice by the scan pitch Z within lines a1 to c3 of width X, and n is 2 in this case.

When Equation (2) is true and n is an integer larger than 1, line a2 that forms a part of the initial right outer line and line c3 that forms part of the final left outer line necessarily correspond. In such a case, in the completed polycrystalline silicon layer, unevenly crystallized area y and evenly crystallized area G are alternately arranged at regular intervals. That is, under the condition that Equation (2) is true and n is an integer larger than 1, the laser beam has a structure where a part of initial right outer line and a part of final left outer line correspond. Based on such a structure, the completed polycrystalline silicon layer has unevenly crystallized area y and evenly crystallized area G alternately arranged at regular intervals.

As another embodiment, a case where n is 3 will be explained.

Figure 5:
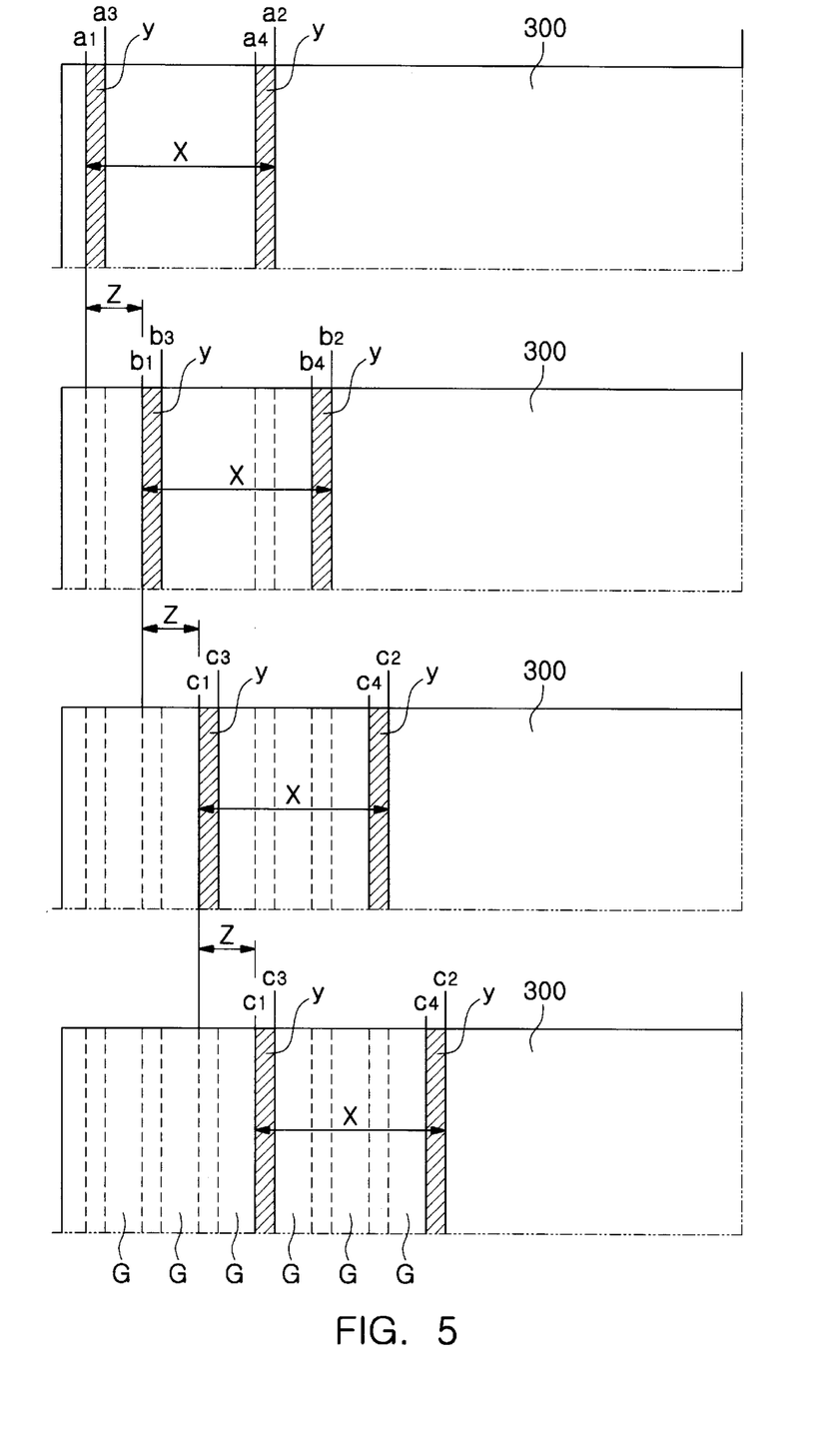
FIG. 5 shows a concept of a laser beam scanning process according to another embodiment of the present invention.

As shown in FIG. 5, when the laser beam having outer lines a1 and a2 forms outer lines b1 and b2 by moving by the amount of scan pitch Z, forms again outer lines c1 and c2 by moving by the scan pitch Z, and forms again outer lines d1 and d2 by moving by the scan pitch Z, the laser beam has a structure where line a2, i.e., part of initial right outer line, and line d3, i.e., part of final left outer line, correspond.

In this case, the laser beam moves three times by the amount of scan pitch Z within lines a1 to d3 of the width X, and n is defined as 3. The completed polycrystalline silicon layer has a structure where unevenly crystallized area y and evenly crystallized area G are alternately arranged at regular intervals.

In summary, if Equation (2) is true and n is an integer larger than 1, the laser beam has a structure where part of initial right outer line and part of final left outer line correspond. As a result, the completed polycrystalline silicon layer has a structure where unevenly crystallized area y and evenly crystallized area G alternately arranged at regular intervals.

When the above-explained Equation (2) is applied with respect to scan pitch Z, Equation (1) for alternately arranging unevenly crystallized area y and evenly crystallized area G at regular intervals can be obtained.

Here, values of the width X of laser beam and unevenly crystallized area y are those that can be easily obtained by examining the characteristics of the laser tool radiating the laser beam. Therefore, the value of scan pitch Z of a laser beam can be easily obtained by Equation (1) in production lines.

If the entire width X of laser beam is 330 $\mu$m, unevenly crystallized area y of laser beam is 30 $\mu$m, and the laser beam moves two times by the scan pitch Z within width X, scan pitch Z can be easily obtained by Equation (1); (330−30)/2=150 $\mu$m.

Then, in production lines, the value of scan pitch Z, i.e., 150 $\mu$m is input to a facility controller (not shown). The facility controller moves XY table 200 forward by controlling it according to the input value. Thus, the laser beam radiated from laser tool 100 may rapidly scan a surface of amorphous silicon layer 300 in accordance with the calculated scan pitch Z.

X and Z in Equation (1) is required to necessarily satisfy Equation (3) as follows.

$$X>Z \qquad \text{Equation (3)}$$

If width X of laser beam has value a smaller than that of scan pitch Z of laser beam, the laser beam is not superposed, which might fail the Equation (1). To prevent this, it is required that X and Z used in the equations of the present invention always satisfy Equation (3).

Figure 6:
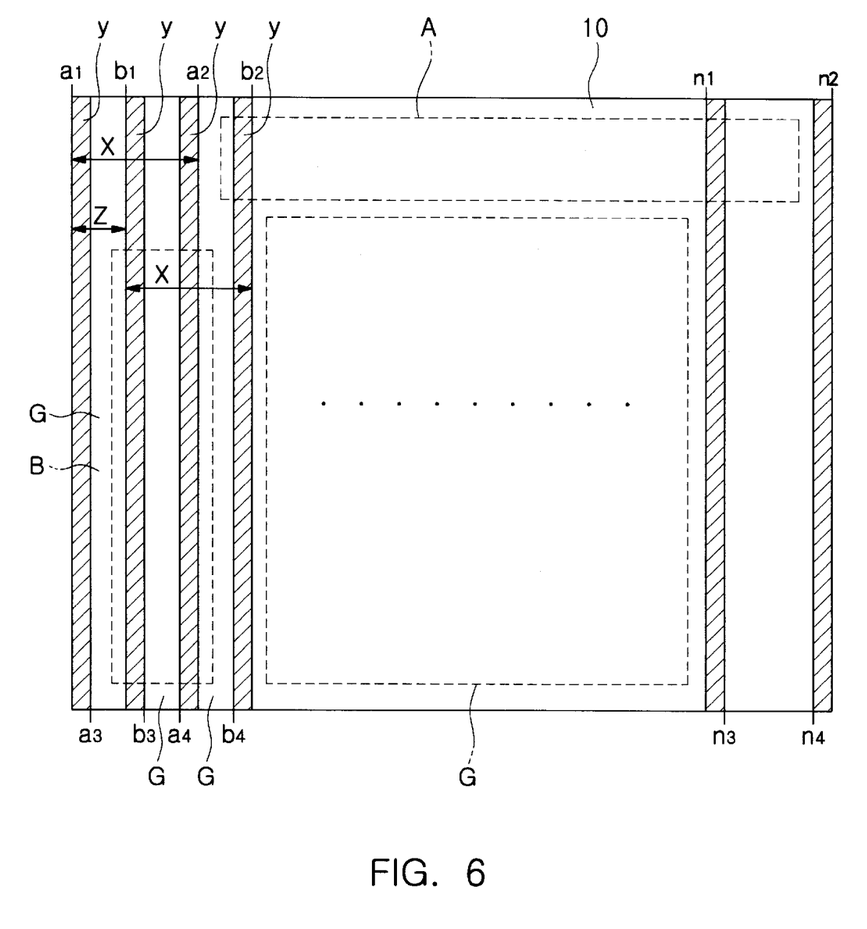
FIG. 6 shows a concept of a substrate manufactured according to the present invention.

The laser beam scanning fabricates a substrate to have a polycrystalline silicon layer that has an unevenly crystallized area y and an evenly crystallized area G alternately arranged at regular intervals, as shown in FIG. 6, wherein n is 2.

A portion occupied by an evenly crystallized area G within each scan pitch Z is determined by Equation (4) as follows.

$$Q_g(\%)=(Z-y)/Z\times 100 \qquad \text{Equation (4)}$$

(wherein, $Q_g$ is a portion occupied by evenly crystallized area, Z is a scan pitch of a laser beam, and y is an unevenly crystallized area)

If the unevenly crystallized area y is 30 $\mu$m, and the scan pitch Z calculated by Equation (1) is 150 $\mu$m, a portion $Q_g$ occupied by an evenly crystallized area G within each scan pitch Z is (150−30)/150×100=80%.

It is required that Z and y in Equation (4) necessarily satisfy Equation (5) as follows.

$$Z > y \qquad \text{Equation (5)}$$

If the scan pitch Z is smaller than the unevenly crystallized area y, a portion occupied by the evenly crystallized area G is 0% or below, according to the Equation (4). To prevent this, it is required that X and Z used in the equations of the present invention always satisfy Equation (5).

When the above-described laser beam scanning process is finished, and overall area of the amorphous silicon layer is crystallized to a polycrystalline silicon layer, active patterns spaced by a predetermined pitch are formed partially in the polycrystalline silicon layer, e.g., in source drive circuit area A, gate drive circuit area B, or in pixel area C (steps S4 and S5).

Here, spacing pitch Z' of active patterns is integer-proportional to the scan pitch Z of the laser beam, say, "Z, 2Z, 3Z, 4Z, . . . ". As a result, the spacing pitch of active patterns is controlled to an appropriate value based on the scan pitch of the laser beam. The spacing pitch Z' of active patterns is integer-proportional to the scan pitch Z of the laser beam, such as, "Z, 2Z, 3Z, 4Z, . . . ". As a result, the spacing pitch of active patterns is controlled to an appropriate value based on the scan pitch of the laser beam.

Here, if each active pattern is formed in source drive circuit area A, each active pattern will serve as those for a source drive circuit. Similarly, if each active pattern is formed in pixel area C, each active pattern will serve as those for a pixel.

In the present invention, active patterns are controlled to have an appropriate spacing pitch based on the scan pitch of the laser beam. In conventional methods, active patterns are formed independently of the scan pitch of the laser beam.

To control the spacing pitch of the active patterns based on the scan pitch of the laser beam, in the present invention, spacing pitch of active patterns may have a relation with respect to the scan pitch of the laser beam, as the following Equation (6).

$$Z' = nZ \qquad \text{Equation (6)}$$

(wherein, Z' denotes the spacing pitch of active patterns, Z denotes the scan pitch of a laser beam, and n is an integer)

When Equation (6) is true, n is an integer 1 or above, and a spacing pitch Z' of active patterns is integer-proportional to the scan pitch Z of a laser beam, such as, "Z, 2Z, 3Z, 4Z, . . . ". As a result, the spacing pitch of active patterns is controlled to an appropriate value based on the scan pitch of a laser beam.

If the entire width X of a laser beam is 330 μm, unevenly crystallized area y of laser beam is 30 μm, and the laser beam moves twice by the scan pitch Z within width X, the scan pitch Z can be easily obtained by Equation (1); (330−30)/2=150 μm. In this case, the spacing pitch Z' of active patterns has values of "150 μm, 300 μm, 450 μm, 600 μm . . . ", according to Equation (6).

When the present invention is achieved, active patterns are formed selectively only in the evenly crystallized area G, avoiding the unevenly crystallized area y of a polycrystalline silicon layer. Thus, active patterns normally perform their unique function.

The process of forming active patterns will be explained in more detail with reference to FIG. 7.

The assumption is still that width X of a laser beam is 330 μm, unevenly crystallized area y of a laser beam is 30 μm, and the laser beam moves twice by the scan pitch Z within width X, the scan pitch Z can be easily obtained by Equation (1); (330−30)/2=150 μm.

Figure 7:
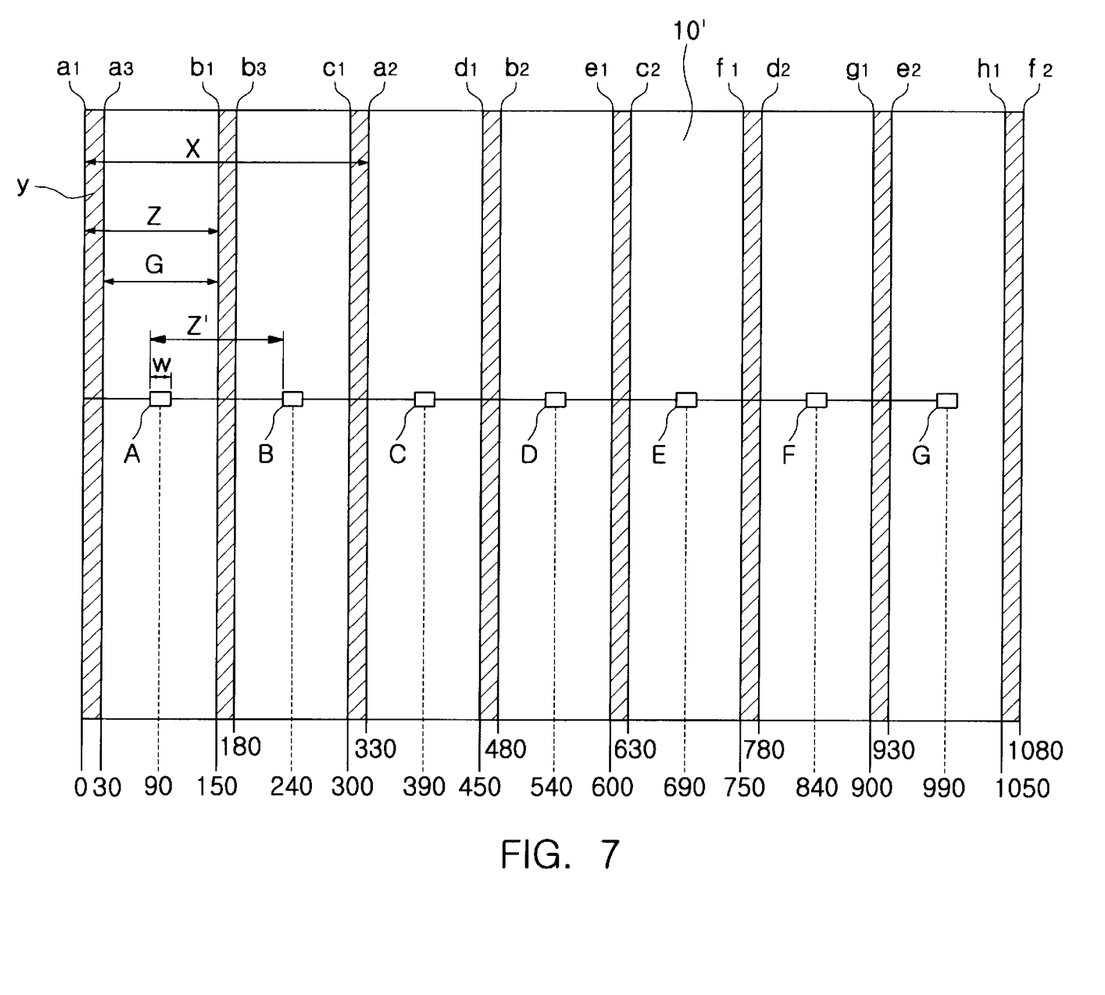
FIG. 7 shows a concept of a process of forming active patterns according to the present invention.

As shown in FIG. 7, the laser beam with width X of 330 μm and having outer lines a1 and a2 forms another outer lines b1 and b2 by moving by the pitch Z of 150 μm, for example. Then, the laser beam forms other outer lines c1 and c2 by moving again by the pitch Z of 150 μm, and forms still other outer lines d1 and d2 by moving again by the amount of pitch Z of 150 μm. Crystallization of amorphous silicon layer 300 is completed by repeating such an operation.

The laser beam applied to the scanning process forms superposed areas between lines b1 and a2, or between c1 and b2. In addition, the laser beam forms unevenly crystallized area y having a low energy density between lines a1 and a3, between lines b1 and b3, or between lines c1 and a2.

When amorphous silicon layer 300 is all crystallized to polycrystalline silicon layer 10 through the above-described laser beam scanning process, active patterns spaced by a predetermined pitch are formed partially in polycrystalline silicon layer 10.

Here, the spacing pitch Z' of active patterns is calculated by Equation (6), and maintains a value of 150 μm, which corresponds to 1 time of 150 μm, i.e., a scan pitch Z of the laser beam.

In the present invention, if an initial active pattern A having width W of 20 μm is arranged in the evenly crystallized area G, the next active pattern B is formed such that the spacing pitch Z' of 150 μm can be maintained with respect to the active pattern A. The same applies to the next active pattern C, and the spacing pitch Z' of 150 μm is still maintained between active patterns B and C.

The subsequently formed active patterns "D, E, F, G . . . " are all formed by spacing pitch of 150 μm, to thereby complete an arrangement shown in FIG. 7. All active patterns formed herein have a width of 20 μm, like the active pattern A.

According to the present invention, active patterns are formed selectively only in an evenly crystallized area G, avoiding an unevenly crystallized area y of a polycrystalline silicon layer. Thus, active patterns normally perform their unique function.

To confirm this, each active pattern arranged in an evenly crystallized area G will be individually explained as follows.

For convenience, positions of active patterns will be represented by its center. That is, if an active pattern A is positioned in an area of 80 μm to 100 μm, with width W of 20 μm, from the left edge serving as a start point, the position of active pattern A will be 90 μm, center of range 80 μm to 100 μm.

Then, the next active pattern B is formed having a spacing pitch of 150 μm, from 90 μm where active pattern A is formed. So, active pattern B is positioned at 240 μm from the left edge serving as a start point. Of course, the spacing pitch 150 μm between active patterns A and B is integer-proportional (this case, 1 time) to the scan pitch 150 μm of laser beam.

Here, active pattern 13 is positioned at 240 μm, and the adjacent unevenly crystallized area y is positioned at 150 μm to 180 μm, and 300 μm to 330 μm, respectively. Thus, active pattern B is positioned in an evenly crystallized area G, and performs its function without fail.

The next active pattern C is formed having a spacing pitch of 150 μm, from 240 μm where active pattern B is formed. That is, active pattern B is positioned at 390 μm from the left edge serving as a start point. Here, unevenly crystallized area y adjacent to active pattern C is positioned at 300 μm to 330 μm, and 450 μm to 480 μm, respectively. Thus, active pattern C is positioned in an evenly crystallized area G, and performs its function without fail.

The next active pattern D is formed having a spacing pitch of 150 μm, from 390 μm where active pattern C is formed. That is, active pattern B is positioned at 540 μm from the left edge serving as a start point. Here, unevenly crystallized area y adjacent to active pattern D is positioned at 450 μm to 480 μm, and 600 μm to 630 μm, respectively. Thus, active pattern D is positioned in an evenly crystallized area G, and performs its function without fail.

The next active pattern E is formed having a spacing pitch of 150 μm, from 540 μm where active pattern D is formed. That is, active pattern E is positioned at 690 μm from the left edge serving as a start point. Here, unevenly crystallized area y adjacent to active pattern E is positioned at 600 μm to 630 μm, and 750 μm to 780 μm, respectively. Thus, active pattern E is positioned in an evenly crystallized area G, and performs its function without fail.

The next active pattern F is formed having a spacing pitch of 150 μm, from 690 μm where active pattern E is formed. That is, active pattern F is positioned at 840 μm from the left edge serving as a start point. Here, unevenly crystallized area y adjacent to active pattern F is positioned at 750 μm to 780 μm, and 900 μm to 930 μm, respectively. Thus, active pattern F is positioned in an evenly crystallized area G, and performs its function without fail.

The next active pattern G is formed having a spacing pitch of 150 μm, from 840 μm where active pattern F is formed. That is, active pattern G is positioned at 990 μm from the left edge serving as a start point. Here, unevenly crystallized area y adjacent to active pattern G is positioned at 900 μm to 930 μm, and 1050 μm to 1080 μm, respectively. Thus, active pattern G is positioned in an evenly crystallized area G, and performs its function without fail.

As described above, in the present invention, each active pattern is prevented from being positioned in an unevenly crystallized area y by calculating the spacing pitch Z' of active patterns based on the scan pitch Z of the laser beam.

Cases where a spacing pitch Z' of an active pattern is determined without considering the scan pitch Z of the laser beam will be explained with reference to FIG. 8. In such cases, active patterns are partially positioned in an unevenly crystallized area y, different from those according to the present invention.

Figure 8:
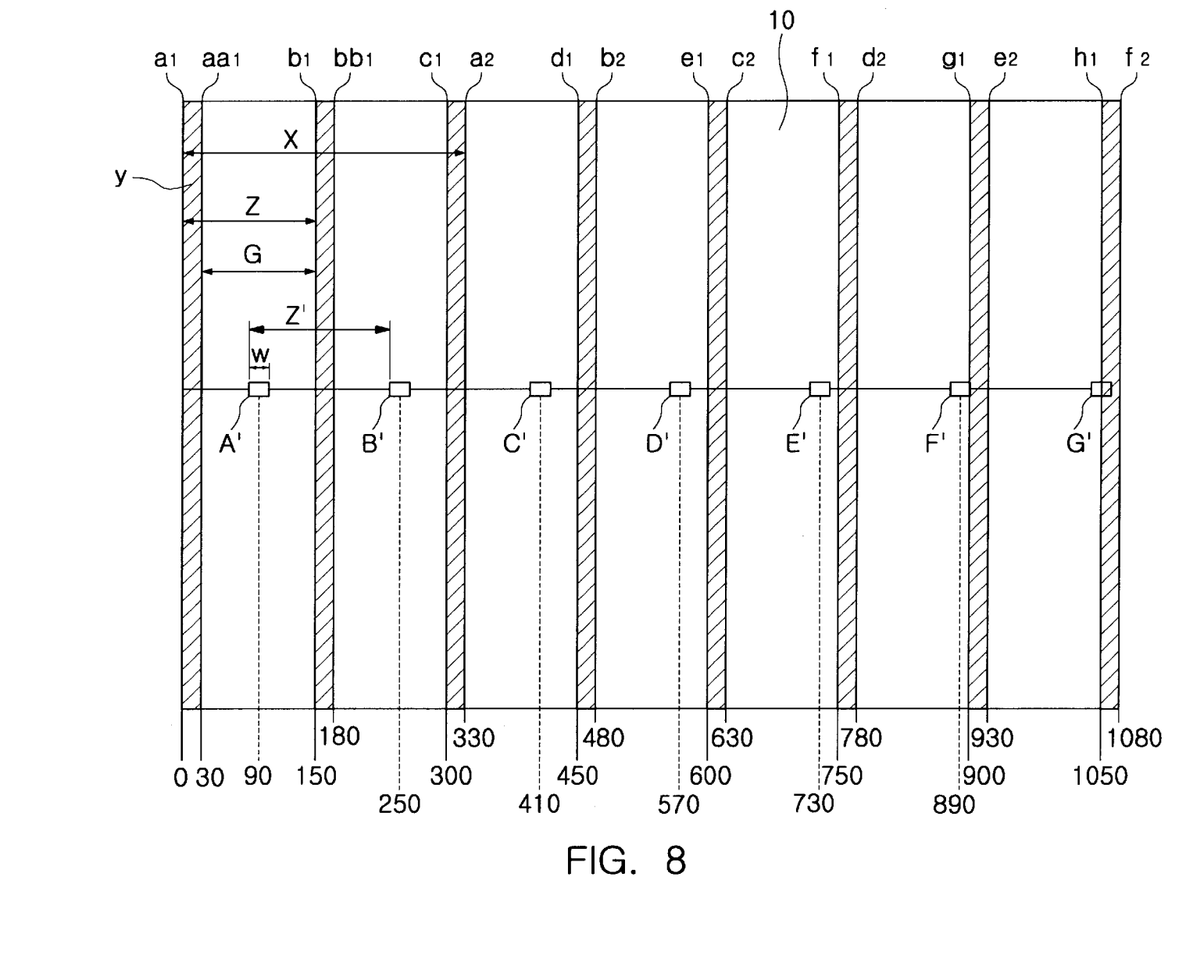
FIG. 8 shows a concept of a process of forming active patterns according to a contrary example of the present invention.

Referring to FIG. 8, active pattern B' is formed having a spacing pitch of 160 μm, from 90 μm where active pattern A' is formed. That is, active pattern B' is positioned at 250 μm starting from the left edge. Spacing pitch 160 μm between active patterns A' and B' does not satisfy the relation defined in Equation (6), with respect to the scan pitch of the laser beam, i.e., 150 μm.

Because active pattern B' is positioned at 250 μm, and an unevenly crystallized area y adjacent thereto is positioned at 150 μm to 180 μm, and 300 μm to 330 μm, respectively, active pattern B' is positioned in an evenly crystallized area G. However, unlike the embodiment of FIG. 7, active pattern B' is positioned closer (approximately 50 μm off) to the unevenly crystallized area of 300 μm to 330 μm.

Active pattern C' is formed having a spacing pitch of 160 μm, from 250 μm where active pattern B' is formed. That is, active pattern C' is positioned at 410 μm starting from the left edge. Here, because the unevenly crystallized area y adjacent to active pattern C' is positioned at 300 μm to 330 μm, and 450 μm to 480 μm, respectively, active pattern C' is positioned in an evenly crystallized area G. However, active pattern C' is positioned closer (approximately 40 μm off) than the active pattern B' to the unevenly crystallized area of 450 μm to 480 μm.

Active pattern D' is formed having a spacing pitch of 160 μm, from 410 μm where active pattern C' is formed. That is, active pattern D' is positioned at 570 μm starting from the left edge. Here, because the unevenly crystallized area y adjacent to active pattern D' is positioned at 450 μm to 480 μm, and 600 μm to 630 μm, respectively, active pattern D' is positioned in an evenly crystallized area G. However, active pattern D' is positioned much closer (approximately 30 μm off) than active pattern C' to the unevenly crystallized area of 600 μm to 630 μm.

Active pattern E' is formed having a spacing pitch of 160 μm, from 570 μm where active pattern D' is formed. That is, active pattern E' is positioned at 730 μm starting from the left edge. Here, because the unevenly crystallized area y adjacent to active pattern E' is positioned at 600 μm to 630 μm, and 750 μm to 780 μm, respectively, active pattern E' is positioned in the evenly crystallized area G. However, active pattern E' is positioned much closer (approximately 20 μm off) than active pattern D' to the unevenly crystallized area of 750 μm to 780 μm.

Active pattern F' is formed having a spacing pitch of 160 μm, from 730 μm where active pattern E' is formed. That is, active pattern F' is positioned at 890 μm starting from the left edge. Here, because unevenly crystallized area y adjacent to active pattern F' is positioned at 750 μm to 780 μm, and 900 μm to 930 μm, respectively, active pattern F' is positioned in an evenly crystallized area G. However, active pattern F' is positioned more closer (approximately 10 μm off) than active pattern E' to the unevenly crystallized area of 900 μm to 930 μm.

As described above, active patterns A' to F' are not exactly positioned in the unevenly characterized area y, though gradually becoming adjacent to those area.

However, active pattern G' causes a problem of finally positioning in the unevenly crystallized area.

As shown in FIG. 8, active pattern G' is formed having a spacing pitch of 160 μm, from 890 μm where active pattern F' is formed. That is, active pattern G' is positioned at 1050 μm starting from the left edge. However, the unevenly crystallized area y adjacent to active pattern G' is positioned at 900 μm to 930 μm, and 1050 μm to 1080 μm, respectively, and active pattern G' is positioned at 1050 μm from the left edge of the substrate serving as a start point. Therefore, active pattern G' is positioned in the unevenly crystallized area y, for example, in the area of 1050 μm to 1080 μm.

If active pattern G' is thus-positioned in an unevenly crystallized area y among the overall area of a polycrystalline silicon layer, active pattern G' cannot perform its function.

To summarize, if a spacing pitch Z' of active patterns does not satisfy Equation (6) with respect to the scan pitch Z of a laser beam, active patterns may be positioned in the unevenly crystallized area y of the polycrystalline silicon layer 10.

In the present invention, the spacing pitch Z' of active patterns satisfies Equation (6) with respect to the scan pitch Z of a laser beam, and active patterns are not positioned in the unevenly crystallized area. As a result, active patterns perform its functions without fail.

Here, in the present invention, the evenly crystallized area G of polycrystalline silicon layer 10 is formed, at least, larger than width W of active patterns so as to satisfy the following Equation (7).

$$W \leq G \qquad \text{Equation (7)}$$

(wherein, W is a width of active patterns, and G is an evenly crystallized area)

If the completed polycrystalline silicon layer 10 has an evenly crystallized area G smaller than the width of active patterns, active patterns are inevitably positioned in an unevenly crystallized area y of polycrystalline silicon layer 10 regardless of the scan pitch Z of a laser beam or the spacing pitch Z' of active patterns. To prevent this, in the present invention, evenly crystallized area G of polycrystalline silicon layer 10 is always formed wider than width W of active patterns, when scanning a laser beam by a predetermined pitch.

At this time, evenly crystallized area G satisfies Equation (8) with respect to the scan pitch Z of a laser beam and the unevenly crystallized area y. The scan pitch Z of a laser beam satisfies Equation (9) with respect to the spacing pitch of active patterns based on Equation (6). Therefore, when Equation (7) is re-arranged with reference to Equations (8) and (9), the width of active patterns satisfies Equation (10) with respect to the spacing pitch of active patterns.

$$G = Z - y \quad \text{Equation (8)}$$

$$Z = Z'/n \quad \text{Equation (9)}$$

$$W \leq Z'/n - y \quad \text{Equation (10)}$$

In production lines, Equation (10) has to be met when each active pattern is designed, and it is required that each active pattern is always positioned in an evenly crystallized area G. Here, n is an integer 1 or above, since n has the same value as that of Equation (6).

Figure 9:
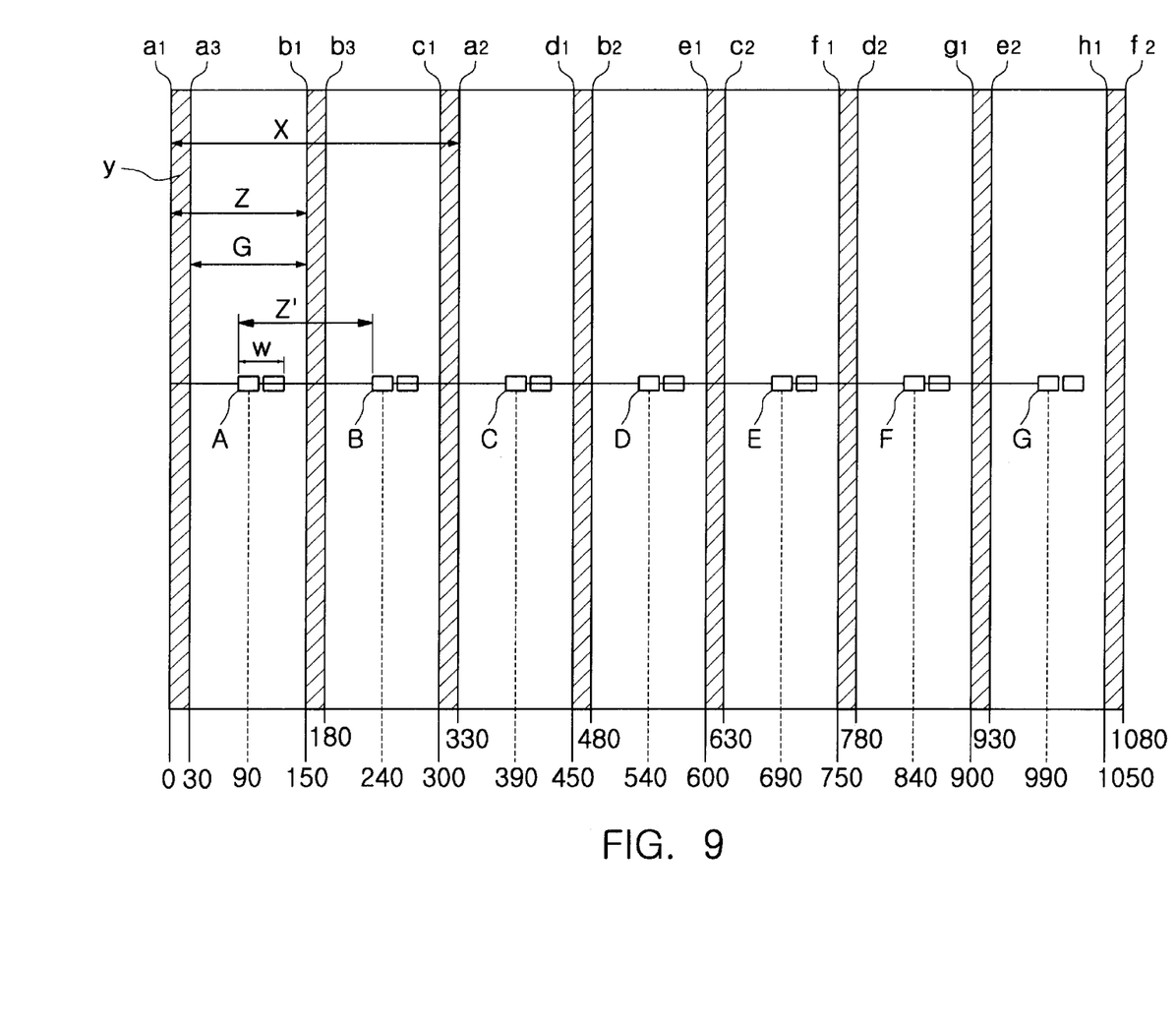
FIG. 9 shows a concept of a process of forming active patterns according to the present invention.

Meanwhile, active patterns of the present invention may be arranged in a group, as shown in FIG. 9, instead of being individually arranged. In such a case, active patterns have a predetermined width W by each group unit.

When active patterns are arranged in group, it is required that the width W of each active pattern group has to satisfy Equations (7) and (10), in production lines.

Even when other embodiment of the present invention is applied, the spacing pitch Z' of active patterns by each group unit is appropriately controlled according to the scan pitch Z of the laser beam, as aforementioned. Accordingly, the spacing pitch of active patterns by each group unit satisfies Equation (6).

When Equation (6) is true, n is an integer 1 or above, and spacing pitch Z' of active patterns by group unit is integer-proportional to the scan pitch Z of the laser beam, such as, "Z, 2Z, 3Z, 4Z, . . . ". As a result, spacing pitch Z' of active patterns by group unit is controlled to an appropriate value based on the scan pitch Z of the laser beam.

Here, if each active pattern in group is formed in source drive circuit area A, each active pattern will serve as those for a source drive circuit. Similarly, if each active pattern in group is formed in pixel area C, each active pattern will serve as those for a pixel.

Figure 10:
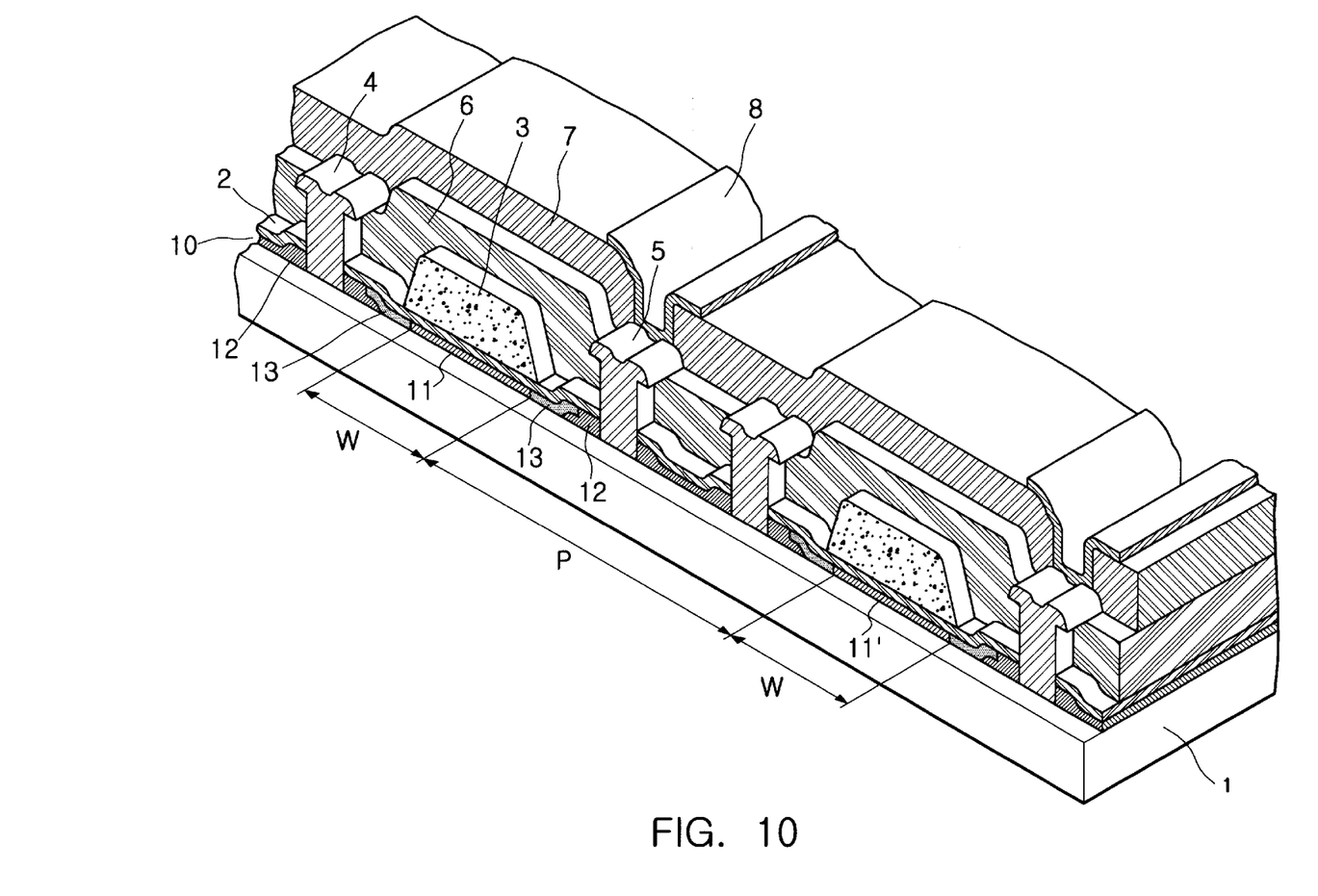
FIG. 10 shows a thin film transistor of the present invention.

When the present invention is completed, active pattern 11 and active pattern 11' of polycrystalline silicon layer 10 maintain spacing pitch Z' which is integer-proportional to the scan pitch Z of a laser beam, as shown in FIG. 10.

Here, it is clear that width W of active patterns 11 and 11' maintains smaller than evenly crystallized area G.

Active patterns 11 and 11' may have at both side surfaces thereof a pair of high-density doped areas 12 and a pair of low-density doped areas 13, which serve to prevent various problems that might occur by carriers transferring between active patterns 11 and 11', for example, a hot carrier effect.

When active patterns 11 and 11' are all formed, additional components for a TFT, such as, a gate electrode, source/drain electrodes, and a pixel electrode are subsequently formed.

To cover active patterns 11 and 11', $SiO_2$ is deposited over polycrystalline silicon layer 10, to form a gate insulation film 2 (step S6). Such a gate insulation film 2 is formed by a PECVD method.

Subsequently, Al—Nd and Mo are sequentially deposited on gate insulation film 2. Al—Nd, and Mo are deposited by a sputtering method, for example. Then, a photoetching process using a mask is performed so as to accurately etch Al—Nd, and Mo. As a result, a gate electrode 3 having a deposited layer structure of Al—Nd/Mo and corresponding to the position of active patterns is formed (step S6). Gate electrode 3 can be formed as a single layer structure using metals like Al, Ta, W, or Cr.

Subsequently, SiNx is deposited over gate insulation film 2 including gate electrode 3, to thereby form an interlayer insulation film 6 (step S7). Such an interlayer insulation film 6 is formed by a PECVD method, for example.

Then, a photoetching process using a mask is performed so as to partially pattern interlayer insulation film 6 and gate insulation film 2 at the same time. Thus, high-density doped area 12 of polycrystalline silicon layer 10 is exposed via a contact hole (step S7).

Subsequently, to fill the contact hole, a metal layer of Cr/Al is deposited on interlayer insulation film 6 by a sputtering method. Then a photoetching process using a mask is performed so as to pattern the deposited metal layer. As a result, a source electrode 4 and a drain electrode 5 having an exposed structure and electrically contacting polycrystalline silicon layer 10 are formed, respectively (step S8).

Then, SiNx is deposited on interlayer insulation film 6 including source/drain electrodes 4 and 5, to thereby form an interlayer insulation film 7 (step S8). Interlayer insulation film 7 is formed by a PECVD method, for example.

Then, a photoetching process using a mask is performed so as to partially pattern interlayer insulation film 7, thereby exposing drain electrode 5 via a contact hole.

To fill the contact hole, an Indium Tin Oxide (ITO) layer is deposited on interlayer insulation film 7 by PECVD method. Then, the deposited ITO layer is patterned by a photolithography process. As a result, a pixel electrode 8 which electrically contacts drain electrode 5 and has a structure exposed upwardly from interlayer insulation film 7 is formed (step S9).

When the above-described processes are all finished, a TFT of the present invention is fabricated.

In the present invention, a spacing pitch of active patterns maintains the relation with respect to the scan pitch of a laser beam, as specified in Equation (6) to prevent active patterns from positioning in an unevenly crystallized area, which assures each active pattern to perform its function.

The present invention applies to all types of TFTs manufactured in production lines.

In a method for fabricating a TFT, and a substrate and TFT manufactured using such a method according to the present invention, an amorphous silicon layer is crystallized to a polycrystalline silicon layer by scanning laser beam by a predetermined scan pitch. Subsequently, a spacing pitch of active patterns is controlled based on the scan pitch of a laser beam when active patterns spaced by a predetermined spacing pitch are formed in part of the polycrystalline silicon layer.

For this, in the present invention, spacing pitch of active patterns has a relation of $Z'=nZ$ (wherein, $Z'$ is a spacing pitch of active patterns, $Z$ is a scan pitch of a laser beam, and $n$ is an integer) with respect to the scan pitch of a laser beam. In this case, a spacing pitch of active patterns is integer-proportional to the scan pitch of a laser beam.

When the present invention is applied, each active pattern is selectively formed only in the stable crystallized polycrystalline silicon area. As a result, TFTs that use the present invention can achieve an excellent performance.

While the invention has been described in connection with preferred embodiments and procedures, it is to be understood that it is not intended to limit the invention to the preferred embodiments and procedures. On the contrary, it is intended to cover all alternatives, modifications and equivalence that may be included within the spirit and scope of the invention as defined by the claims appended hereinafter.

What is claimed is:

1. A method for fabricating a thin film transistor, comprising the steps of:

calculating a scan pitch of a laser beam such that an unevenly crystallized area and an evenly crystallized area of a crystallized polycrystalline silicon layer are alternately arranged at a regular interval;

crystallizing an amorphous silicon layer to a polycrystalline silicon layer by scanning a laser beam according to the calculated scan pitch;

calculating a spacing pitch of active patterns from the scan pitch of the laser beam; and forming active patterns in a selected portion of the polycrystalline silicon layer according to the calculated spacing pitch.

2. The method according to claim 1, wherein the scan pitch of a laser beam is calculated by an equation of $$Z=(X-y)/n$$

where, Z is a scan pitch of a laser beam, X is a width of the laser beam, y is a width of the unevenly crystallized area, and n is an integer.

3. The method according to claim 2, wherein X is larger than Z.

4. The method according to claim 2, wherein a portion occupied by the evenly crystallized area within each Z is determined by an equation of $$Q_g(\%)=(Z-y)/Z \times 100$$

where, $Q_g$ is a portion occupied by the evenly crystallized area, Z is a pitch of a laser beam, and y is a width of an unevenly crystallized area.

5. The method according to claim 4, wherein Z is larger than y.

6. The method according to claim 1, wherein the spacing pitch of active patterns is calculated by an equation of $$Z'=nZ$$

where, Z' is a spacing pitch of active patterns, Z is a scan pitch of a laser beam, and n is an integer.

7. The method according to claim 6, wherein the width of the active patterns is equal to or less than that of the evenly crystallized area.

8. The method according to claim 7, wherein width of said active patterns satisfies the following equation with respect to said spacing pitch of said active patterns:

$$W \leq Z'/n - y$$

wherein, W is a width of active patterns, Z' is a spacing pitch of active patterns, y is a width of an unevenly crystallized area, and n is an integer.

9. The method according to claim 1, wherein the laser beam is superposed in each scan pitch.

10. The method according to claim 1, wherein the active patterns are arranged in group, each group is spaced in accordance with the spacing pitch.

* * * * *